United States Patent
Asano et al.

(10) Patent No.: US 6,601,203 B1
(45) Date of Patent: Jul. 29, 2003

(54) TEST PROGRAM GENERATION SYSTEM AND TEST PROGRAM GENERATION METHOD FOR SEMICONDUCTOR TEST APPARATUS

(75) Inventors: Yoshihiro Asano, Yokohama (JP); Yoshiaki Kodashiro, Yokohama (JP); Koji Komuro, Yokohama (JP); Kinji Okabe, Yokohama (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/401,287

(22) Filed: Sep. 23, 1999

(30) Foreign Application Priority Data

Nov. 26, 1998 (JP) .......................................... 10-336148

(51) Int. Cl.[7] .......................... G01R 31/28; G06F 11/00
(52) U.S. Cl. ...................................... 714/738; 702/124
(58) Field of Search ........................... 716/18; 714/724, 714/718, 738, 734, 26, 36, 43, 46, 740, 741, 739; 702/121–124, 91; 706/916; 324/73.1; 713/2

(56) References Cited

U.S. PATENT DOCUMENTS

| | | | | |
|---|---|---|---|---|
| 4,907,230 A | * | 3/1990 | Heller et al. | ................ 706/916 |
| 4,947,355 A | * | 8/1990 | Koeman | ...................... 702/91 |
| 4,964,124 A | * | 10/1990 | Burnett | ........................ 714/44 |
| 5,727,187 A | * | 3/1998 | Lemche et al. | ................ 716/18 |
| 5,901,154 A | * | 5/1999 | Motohama et al. | ......... 714/724 |
| 6,449,741 B1 | * | 9/2002 | Organ et al. | ................... 714/46 |

OTHER PUBLICATIONS

NN9101193: Architecture for a Test Control System in Os/2. (IBM Technical Disclosure Bulletin, Jan. 1, 1991; vol. No.: 33 Issue No.: 8 Page No.: 193–195).*

* cited by examiner

*Primary Examiner*—Albert Decady
*Assistant Examiner*—Guy Lamarre
(74) *Attorney, Agent, or Firm*—Foley & Lardner

(57) ABSTRACT

In test program generation system and test program generation method for semiconductor test apparatus, there is used data necessary for generation of test programs of respective kinds of LSI testers of data of library in which information common to respective kinds of LSI testers are registered, and data of device information file in which inherent device information are registered every kinds of LSIs to convert those data into data of common language independent of inherent various test program languages every kinds of LSI testers to thereby generate test element data used for generation of test programs of respective kinds of LSI testers. Accordingly, preparation of test programs corresponding to respective kinds of LSI testers can be made. Thus, it becomes possible to easily carry out preparation and modification of template files in which measurement sequences prepared every kinds of LSI testers are described.

12 Claims, 6 Drawing Sheets

```
LEVEL   FILE NAME
  VDD DEFINE BEGIN;
    VDDn:SETTING OF POWER SUPPLY
  VDD DEFINE END;

LEVEL DEFINE BEGIN

PIN NAME:
      {
        IN(UNIT SECTION NO.);INPUT REFERENCE VOLTAGE VALUE(H/L);
        OUT(UNIT SECTION NO.);OUTPUT REFERENCE VOLTAGE VALUE(H/L);
        VT(UNIT SECTION NO.);TERMINATION VOLTAGE VALUE;
        IL(UNIT SECTION NO.);LOAD CURRENT VALUE(H/L);
        DCLP(UNIT SECTION NO.);VOLTAGE CLAMP VALUE(H/L);
      };

PIN NAME:
      {
        IN(UNIT SECTION NO.);INPUT REFERENCE VOLTAGE VALUE(H/L);
        OUT(UNIT SECTION NO.);OUTPUT REFERENCE VOLTAGE VALUE(H/L);
        VT(UNIT SECTION NO.);TERMINATION VOLTAGE VALUE;
        IL(UNIT SECTION NO.);LOAD CURRENT VALUE(H/L);
        DCLP(UNIT SECTION NO.);VOLTAGE CLAMP VALUE(H/L);
      };
            :
            :
  LEVEL DEFINE END;
  END;
```

FIG. 2

TEST PROGRAM GENERATION SYSTEM AND TEST PROGRAM GENERATION METHOD FOR SEMICONDUCTOR TEST APPARATUS

BACKGROUND OF THE INVENTION

This invention relates to a test program generation system and a test program generation method for semiconductor test apparatus, i.e., a test program generation system and a test program generation method for LSI tester.

Since reliability is required for semiconductor devices used in various use purposes, completed semiconductor devices are tested using the semiconductor test apparatus (LSI tester). In this case, in order to carry out such a test, it is necessary to generate test programs executed with respect to the LSI testers for a plurality of different kinds of semiconductor devices, i.e., different kinds of LSI testers.

FIG. 6 is a block diagram showing the configuration of a conventional test program generation system for a semiconductor test apparatus, and a conventional test program generation method for a semiconductor test apparatus which is carried out by this test program generation system.

The conventional test program generation system for semiconductor test apparatus shown in FIG. 6 comprises memory 60 adapted so that a group of parameter files in which a plurality of parameter files used for test program generation are included are stored therein, and program translator 61 for carrying out compiling operation and linking operation of data which have been read out from respective parameter files of the group of parameter files to thereby generate test programs 62 of binary files which are executable program. In the group of parameter files stored in the memory 60, there are included test flow file 601 in which measurement items and measurement orders are described, template files 602 in which measurement sequences are described, waveform files 603 in which waveform modes and timing values of signal waveform inputted and outputted with respect to LSI to be measured (DUT), level files 604 in which voltages of signals inputted and outputted with respect to the LSI to be measured are described, pin file 605 in which connection relationship between contact elements of LSI to be measured and contact elements of LSI tester is described, DC measurement condition files 606 in which measurement conditions of DC measurement are described, variable files 607 in which variables and operational expressions are described, pattern list files 608 in which information of execution start address and stop address of test pattern are described, and instance files 609 in which linkages relationship between templates and respective parameters are described.

At the translator 61, there are provided compile means 611 for compiling data stored at respective parameter files 601 to 609, and link means 612 for generating, from compiled data, test program 62 of binary file which is executable program.

The conventional test program generation system for semiconductor test apparatus shown in FIG. 6 is operative to read out respective parameter files 601 to 609 from the memory 60 to compile data stored in the respective parameter files 601 to 609 by the compile means 611 to link the compiled data by the link means 612 to generate test program 62 of binary files which is executable program.

However, in the conventional test program generation system for a semiconductor test apparatus as described above, data stored in respective parameter files 601 to 609 are described by dedicated (specific) test program languages for a plurality of different types of LSI testers. For this reason, there was the problem that a test program dedicated to a specific type of LSI tester can only be generated from specific kinds of respective parameter files 601 to 609. Accordingly, in order to prepare test programs for different types of LSI testers, an operator must prepare such test programs after the operator learns test program languages inherent in respective LSI testers. As a result, much time and labor are required.

In addition, there was also the problem that, as template file 602 of the group of parameter files, there are prepared template files in which sample models of measurement sequences are described in advance by LSI tester maker, but since the configuration is complicated, operator as user cannot easily prepare or modify such file.

SUMMARY OF THE INVENTION

A primary object of this invention is to provide a test program generation system for semiconductor test apparatus capable of preparing test programs corresponding to respective kinds of LSI testers, and capable of easily carrying out preparation and modification of template files in which measurement sequences prepared for every type of LSI testers are described.

A secondary object of this invention is to provide a test program generation method for semiconductor test apparatus capable of quickly generating test programs corresponding to respective kinds of LSI testers.

According to a first aspect of the present invention, there is provided a test program generation system for semiconductor test apparatus comprising:

memory adapted so that there are stored library in which information common to respective kinds of LSI testers are registered, and device information file in which inherent device information are registered every kinds of LSIs; and library extraction/test element data generator for reading out data necessary for generating test programs of the respective kinds of the LSI testers from the library and the device information file of the memory to convert those data into data of common language independent of inherent various test program languages every the kinds of the LSI testers to thereby generate test element data used for generation of test programs of the respective kinds of the LSI testers.

According to a second aspect of the present invention, there is provided a test program generation method for semiconductor test apparatus, comprising:

a first step of converting data necessary for generation of test programs of respective kinds of LSI testers of data of library in which information common to the respective kinds of the LSI testers are registered and data of device information file in which inherent device information are registered every kinds of the LSIs into data of common language independent of the inherent various kinds of test program languages every the kinds of the LSI testers to thereby generate test element data used for generation of test programs of the respective kinds of the LSI testers; and a second step of converting the test element data to thereby prepare test programs correspondingly to every kind of the LSI testers by ASCII format file.

In test program generation system and test program generation method for semiconductor test apparatus according to this invention, such an approach is employed to convert data necessary for generation of test programs of various kinds of LSI testers of data of library in which information common to respective kinds of LSI testers are registered and data of device information file in which inherent (specific) device information are registered for every kind of LSIs into data of common language independent of inherent various test program languages for every kind of LSI testers, thus to generate test element data (intermediate data) used for generation of test programs of various kinds of LSI testers. Accordingly, it is possible to commonly use test element data for the purpose of test program generation of respective kinds of LSI testers.

As a result, an operator only learns test element data constituted by common language independent of inherent test program languages every kinds of LSI testers, thus making it possible to prepare test programs of respective kinds of LSI testers. Namely, there is no necessity of learning inherent test program languages for every kind of LSI testers. Thus, improvement in efficiency of test program preparation of various kinds of LSI testers can be made.

Since conversion of data for generating test element data is carried out in the state classified into a plurality of information files in which necessary test element data is included commonly to generation of test programs of respective kinds of LSI testers and a plurality of template files provided corresponding to every kinds of LSI testers, measurement sequences being described every kinds of LSI testers, test element data being inserted into the measurement sequences, it is possible to use template files for every kind of LSI testers to be caused to undergo generation of test program. On one hand, other plurality of information files can be used commonly to generation of test programs of respective kinds of LSI testers.

Since a plurality of template files are such that input function and output function can be defined or changed after generation of test element data and the plurality of template files, even in the case where there takes place necessity of change in the number or position, etc. of items inserted into the sequence portion of the template file, it is possible to quickly cope with such a change without modifying the configuration of the system itself.

Further, since the plurality of template files are such that after generation of test element data and the plurality of template files, the range to be repeatedly executed of measurement sequences can be designated, template files can be used commonly to devices of respective specifications belonging to the same kind.

In addition, since test element data are registered into library after generation of test element data, individual test element data can be re-utilized and a large number of users can share such test element data.

BRIEF DESCRIPTION OF THE DRAWINGS

In the accompanying drawings:

FIG. 2 is a diagram showing an example of format of level file described by common language independent of test program languages;

DESCRIPTION OF THE PREFERRED EMBODIMENTS

Explanation will be given below with reference to the attached drawings in connection with a preferred embodiment of a test program generation system and a test program generation method for semiconductor test apparatus according to this invention.

Figure 1:
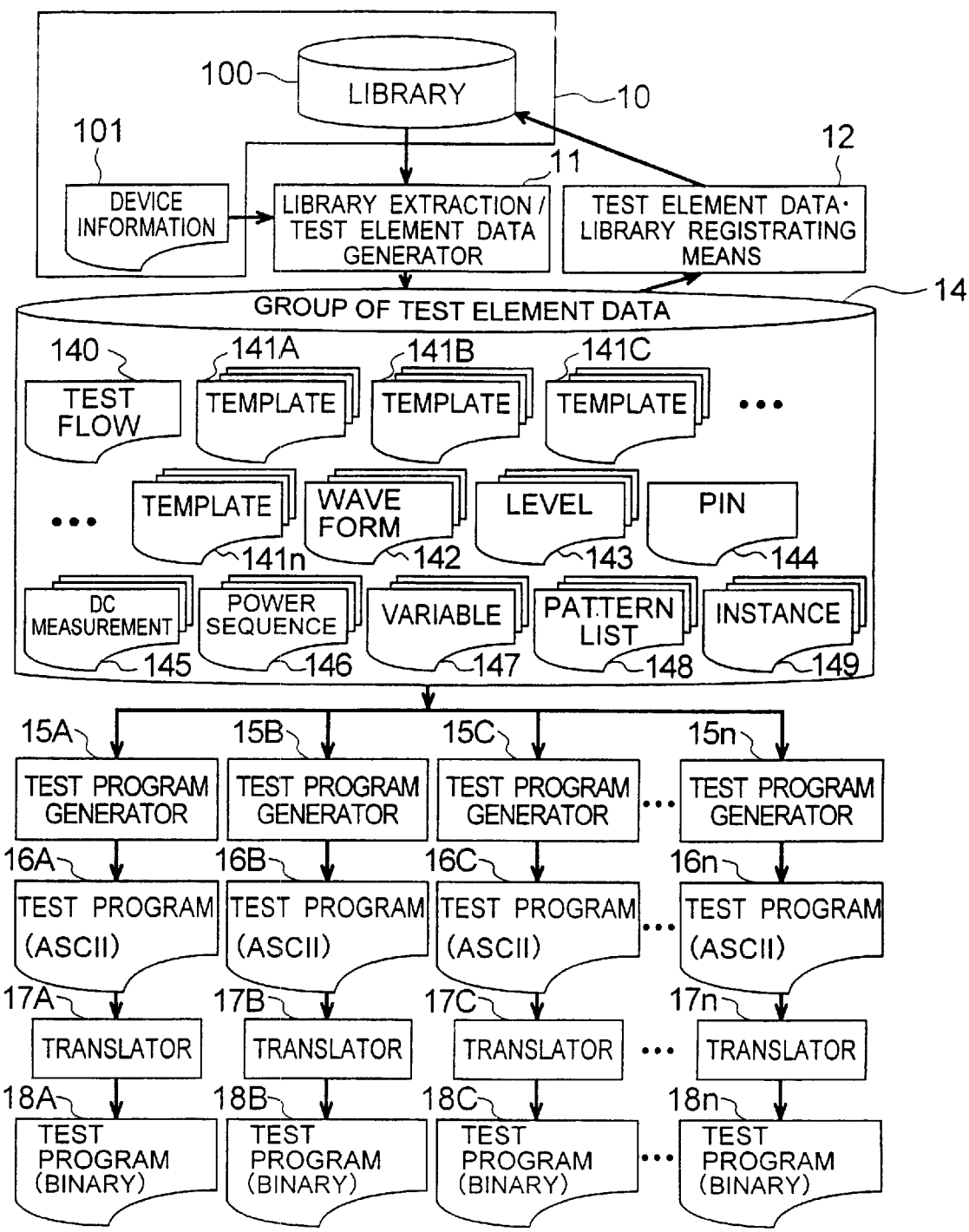
FIG. 1 is a block diagram showing the configuration of an embodiment of a test program generation system for semiconductor test apparatus according to this invention.

FIG. 1 is a block diagram showing the configuration in the preferred embodiment of the test program generation system for semiconductor test apparatus according to this invention, and the preferred embodiment of the test program generation method for semiconductor test apparatus according to this invention is carried out by this test program generation system.

The test program generation system for a semiconductor test apparatus according to this invention shown in FIG. 1 has: memory 10 adapted so that there are stored library 100 in which there are registered information common to various kinds of LSI testers such as the content of measurement method and/or measurement sequence, etc., and device information file 101 in which there are registered inherent (specific) device information for a plurality of different kinds of LSIs such as package standards, arrangement of pin and name of the various LSIs, etc.; library extraction/test element data generator 11 for reading out data necessary for generation of test programs of various kinds of LSI testers from the library 100 and the device information file 101 of the memory 10 to convert such data into data of a common language independent of the various kinds of test program languages to thereby generate test element data of respective files 140 to 149 of group of test element data 14; test element data library registration means 12 for registering test element data included in respective files of the group of test element data thus generated into the library 100 of the memory 10; first, second, third, . . . , n-th test program generator 15A, 15B, 15C, . . . , 15n provided correspondingly for each of the plurality of different kinds of LSI testers in order to convert test element data which have been read out from necessary respective files 140 to 149 of the group of test element data 14 to thereby prepare first, second, third, . . . , n-th test programs 16A, 16B, 16C, . . . , 16n correspondingly for each of the plurality of different kinds of LSI testers by ASCII (American Standard Code for Information Interchange) format file; and first, second, third, . . . , n-th program translator 17A, 17B, 17C, . . . , 17n provided correspondingly for each of the plurality of different kinds of LSI testers in order to carry out a compiling operation and a linking operation of the first, second, third, . . . , n-th test programs 16A, 16B, 16C, . . . , 16n to thereby generate first, second, third, . . . , nth test programs 18A, 18B, 18C, . . . , 18n of binary files which are executable programs correspondingly for each of the plurality of different kinds of LSI testers.

The group of test element data 14 used for generation of test programs which are executable programs can be manually prepared. In this example, however, such an approach is employed to read out, by library extraction/test element data generator 11, from the library 100 and the device information file 101 of the memory 10, data of information common to various kinds of LSI testers such as the content of measurement method and/or measurement sequence, etc. and data of inherent (specific) device information every kinds of LSI such as package standards, and/or arrangement and names of pins, etc. of various kinds of LSIs to convert them into data of common language independent of various test program languages to thereby automatically prepare test element data of respective files 140 to 149 of the group of test element data 14.

In respective files of the group of test element data, there are included test flow file 140 in which measurement items and measurement orders are described, first, second, third, . . . , n-th template files 141A, 141B, 141C, . . . , 141n in which measurement sequences are described for each of a plurality of different kinds of LSIs to be measured, waveform files 142 in which waveform modes and timing values of signal waveforms inputted and outputted with respect to the LSI to be measured, level files 143 in which voltages of signals inputted/outputted with respect to the LSI to be measured are described, pin file 144 in which connecting relationship between contacts of LSI to be measured and probes of the LSI tester is described, DC measurement condition files 145 in which measurement conditions of DC measurement are described, power sequence files 146 in which order and time of power ON/OFF of unit are described, variable files 147 in which variables and operational expressions are described, pattern list files 148 in which information of execution start address and end (stop) address of test pattern are described, and instance files 149 in which connections (linkages) between templates and respective parameters are described.

Figure 6:
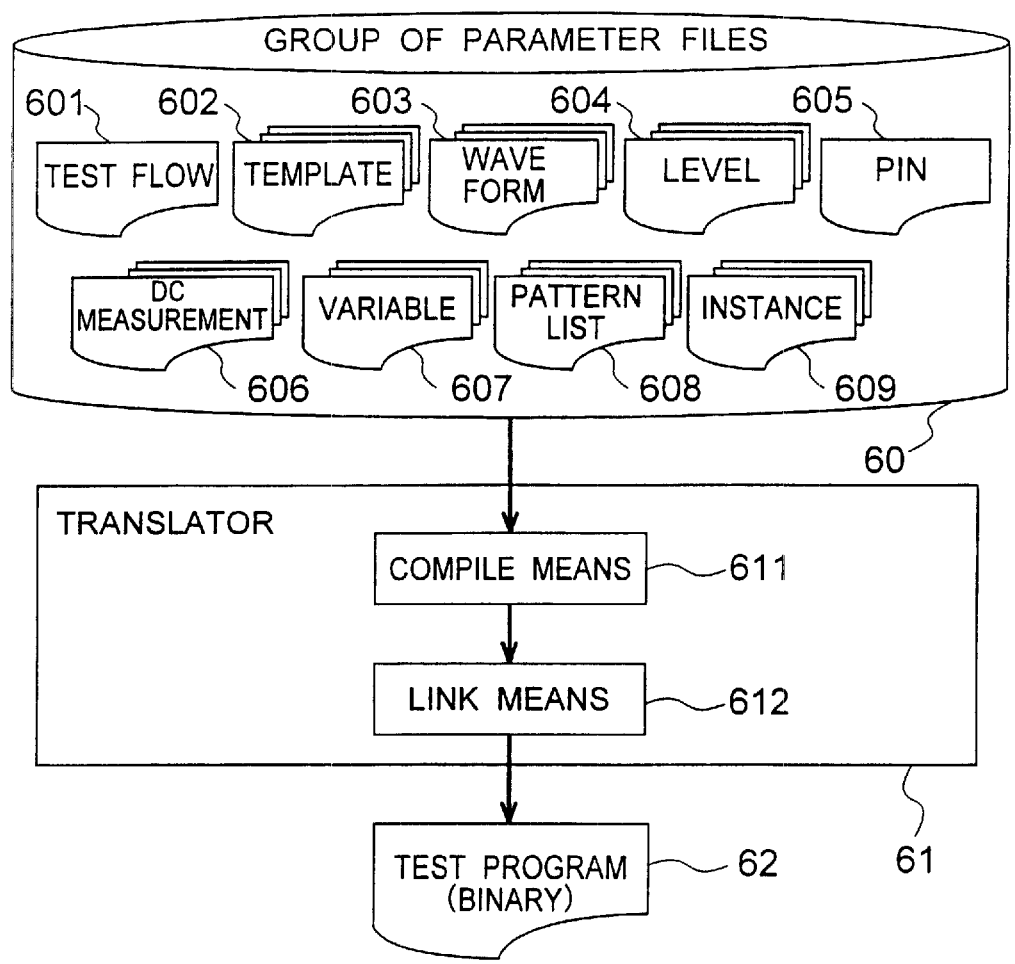
FIG. 6 is a block diagram showing the configuration of conventional test program generation system for semiconductor test apparatus.

The group of test element data in the test program generation system for semiconductor test apparatus according to this invention differs from the group of parameter files in the conventional test program generation system for semiconductor test apparatus shown in FIG. 6 in that respective files of the group of test element data except for first, second, third, . . . , n-th template files 141A, 141B, 141C, . . . , 141n are described by common language independent of inherent (specific) test program languages for each of a plurality of different kinds of LSI testers, and that first, second, third, . . . , n-th template files 141A, 141B, 141C, . . . , 141n are provided correspondingly for each of a plurality of different kinds of LSIs to be measured, i.e., types of LSI testers. The reason why respective files of the group of test element data except for first, second, third, . . . , n-th template files 141A, 141B, 141C, . . . , 141n are described by a common language, and, on one hand, the first, second, third, . . . , n-th template files 141A, 141B, 141C, . . . , 141n are provided correspondingly for each of a plurality of different kinds of LSIs to be measured is that template files are files in which measurement sequences are described for each of a plurality of different kinds of LSIs to be measured.

Individual test element data included in respective files of the group of test element data 14 can be registered at the library 100 of the memory 10 by the test element data library registration means 12. Thus, individual test element data can be re-utilized, or a large number of users can share such data.

FIG. 2 is a diagram showing an example of format of level file 143 described by common language independent of test program languages.

In test program language of LSI tester of a specific kind, setting of power supply is carried out by using the term "VS1", such as, for example, VS1=5.0V (power supply voltage), R8V (voltage application range) and MO. 8A (measurement range). In this case, the term of "VS1" is inherent in test program language of LSI tester of the specific kind, and cannot be used in test program languages of LSI testers of other types. Accordingly, in the case where test program language of LSI tester of such specific type is used to prepare the group of parameter files as in the conventional test program generation system for semiconductor test apparatus shown in FIG. 6, that group of parameter files can be used only in test program generation of the LSI tester of that specific type.

In view of the above, in the test program generation system and test program generation method for semiconductor test apparatus according to this invention, test element data using common language independent of test program languages are caused to be generated to commonly use, e.g., the term of "VDD" for setting of power supply in that test element data. Thus, test element data of respective files included in the group of test element data can be commonly used for test program generation of respective types of LSI testers.

In the example shown in FIG. 2, in addition to setting of power supply "VDD", there are used common languages of "IN" of input reference voltage value, "OUT" of output reference voltage value, "VT" of termination voltage value, "IL" of load current value, and "DCLP" of voltage clamp value, etc.

Then, in the test program generation system for semiconductor test apparatus according to this invention, with data which have been read out from necessary respective files 140 to 149 of the group of test element data 14 being as input data, first, second, third, . . . , n-th test programs 16A, 16B, 16C, . . . , 16n correspondingly for each of a plurality of different types of LSI testers are respectively prepared as ASCII format files by first, second, third, . . . , n-th test program generator 15A, 15B, 15C, . . . , 15n provided correspondingly for each of a plurality of different types of LSI testers. Namely, the first, second, third, . . . , n-th test program generator 15A, 15B, 15C, . . . , 15n read out any one of the first, second, third, . . . , n-th template files 141A, 141B, 141C, . . . , 141n described by test program language corresponding to a kind of LSI designated in advance and test element data of respective files described by common language except for template files to prepare any one of the first, second, third, . . . , n-th test programs 16A, 16B, 16C, . . . , 16n of ASCII file obtained by converting those data into test program language of LSI tester of corresponding type to synthesize them.

Further, first, second, third, . . . , n-th program translator 17A, 17B, 17C, . . . , 17n provided correspondingly for each of a plurality of different types of LSI testers carry out compiling operation and linking operation of first, second, third, . . . , n-th test programs 16A, 16B, 16C, . . . , 16n of the ASCII file to thereby generate first, second, third, . . . , n-th test programs 18A, 18B, 1BC, . . . , 18n of binary files which are executable programs correspondingly for each of a plurality of different types of LSI testers.

Explanation will be given in more practical sense in connection with a method in which test element data included in respective files of the group of test element data are caused to be input, respective test programs of ASCII format file are prepared by respective test program generator, and respective program translator generate respective test programs of binary files which are executable files.

Figure 3:
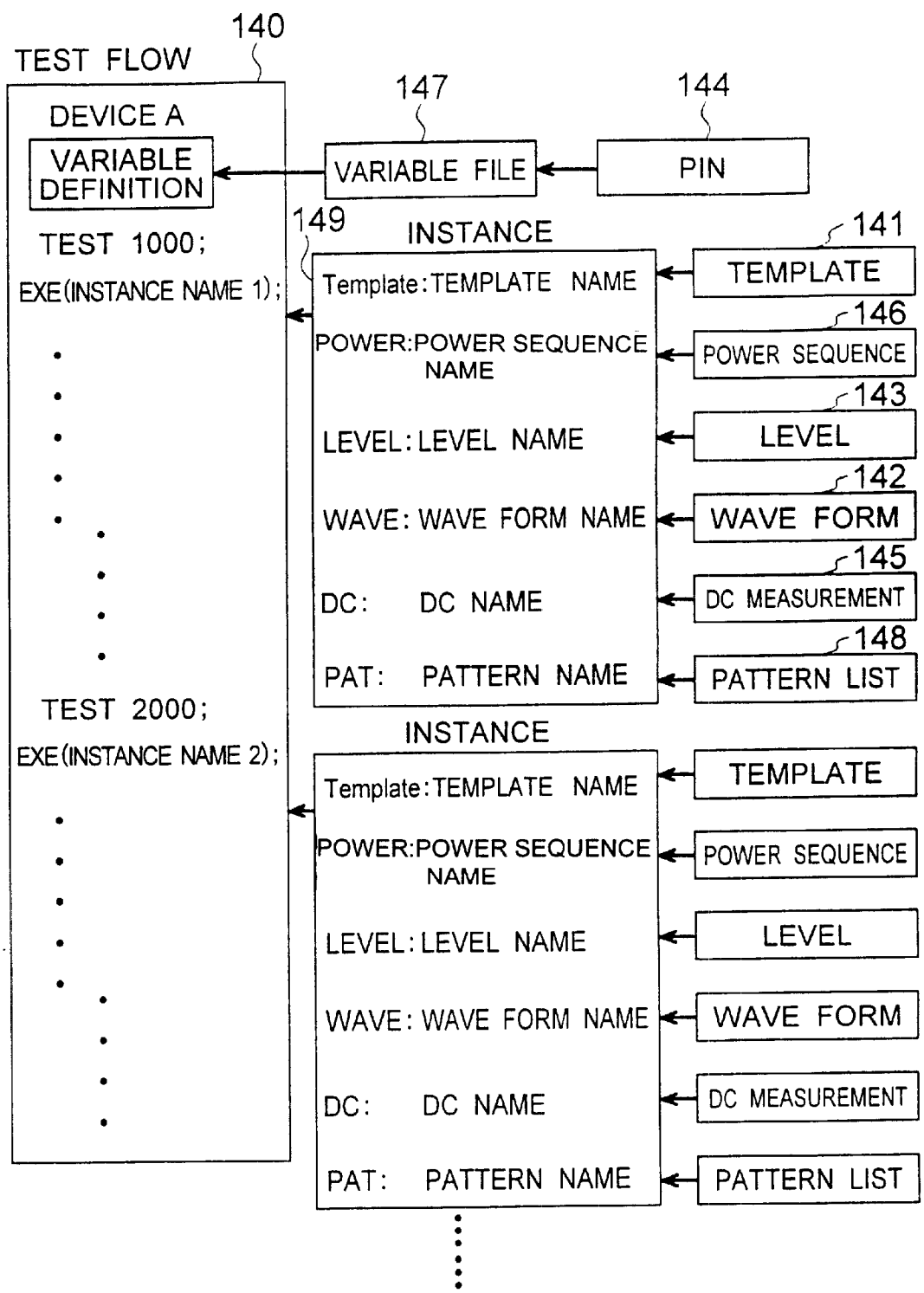
FIG. 3 is an explanatory view showing the relationship between respective files 140 to 149 of a group of test element data 14.

FIG. 3 is an explanatory view showing the relationship between respective files 140 to 149 of the group of test element data 14.

The test flow file 140 designates file name of variable file 147 inserted for definition of variable and initialization and file name of instance file 149 for designating measurement item and measurement order. Instance files 149 are generated every respective measurement items, and designate file name of file necessary for, realizing respective measurement items. The file names designated by the instance file 149 are respective file names of template file 141 (any one of 141A, 141B, 141C, . . . , 141n), power sequence file 146, level file 143, waveform file 142, DC measurement condition file 145 and pattern list file 148. By designating file names in a manner as stated above, correlation between respective files is determined.

Figure 4:
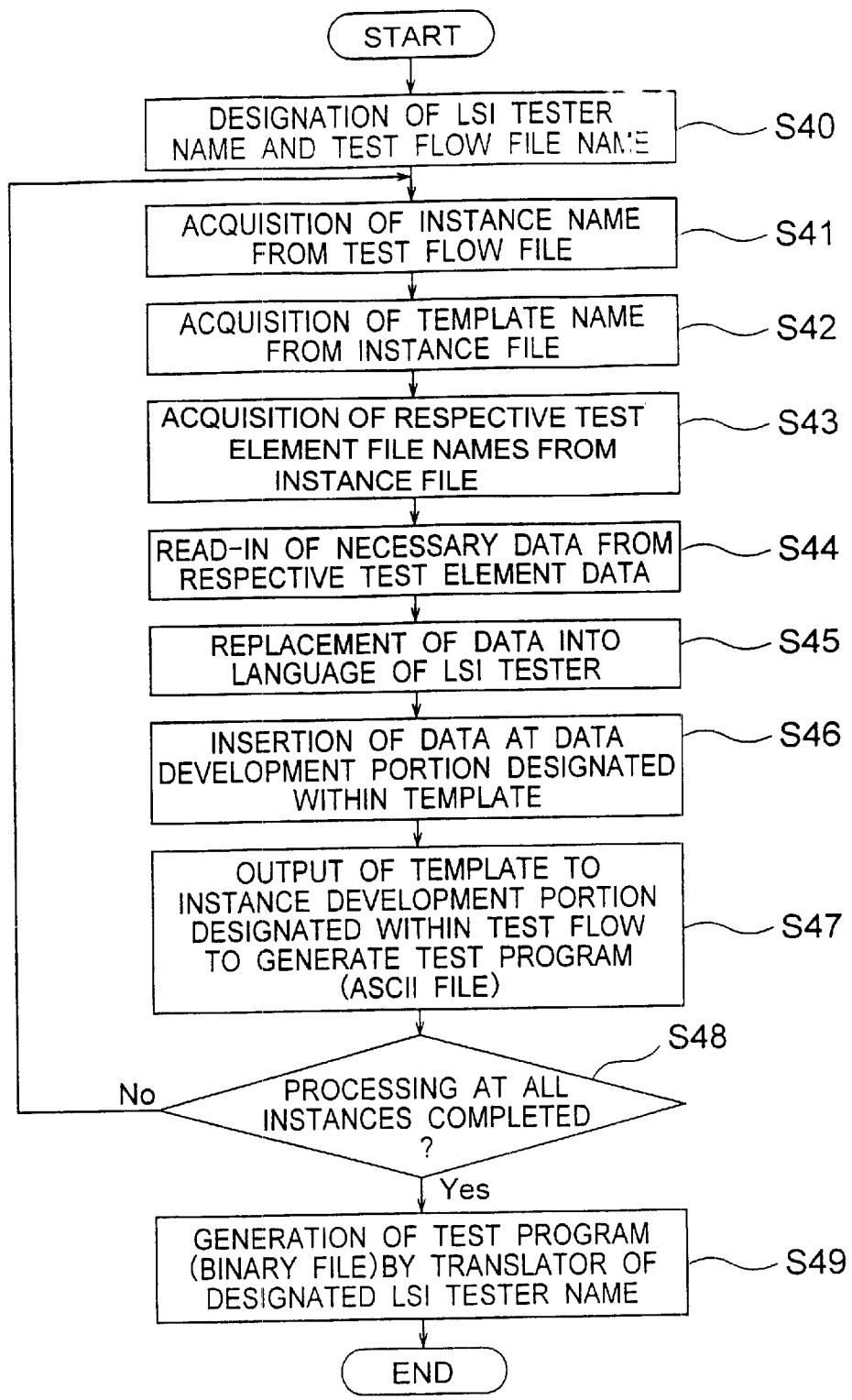
FIG. 4 is a flowchart showing the procedure for generating test program by making use of correlation between respective files.

FIG. 4 is a flowchart showing the procedure for generating test program by making use of correlation between respective files.

Generation of test program is carried out as below. First, LSI tester name using test program and test flow file name of test to be carried out are designated (step S40). After designation of LSI tester name and test flow file name are made, instance name is acquired (obtained) from the designated test flow file (step S41). After acquisition of instance name, template name is acquired from instance file corresponding to that instance name (step S42). Further, file names of respective test element data are acquired from that instance file (step S43). After acquisition of file names of respective test element data, necessary data are read from files of respective test element data corresponding to those file names (step S44). After read operation of necessary test element data, test element data is replaced by data of test program language of the designated LSI tester (step S45). After replacement of data, data of test program language is inserted into data development portion designated within the template (step S46). In addition, template is outputted to instance development portion designated within test flow to generate test program of ASCII file (step S47). The processing of procedure from the above-mentioned steps S41 to S47 is repeated until processing are completed with respect to all instances (step S48). When processing are carried out with respect to all instances, translator corresponding to designated LSI tester name carries out compile operation and link operation of test program of the ASCII format file. Thus, test program of binary file is generated (step S49).

Figure 5:
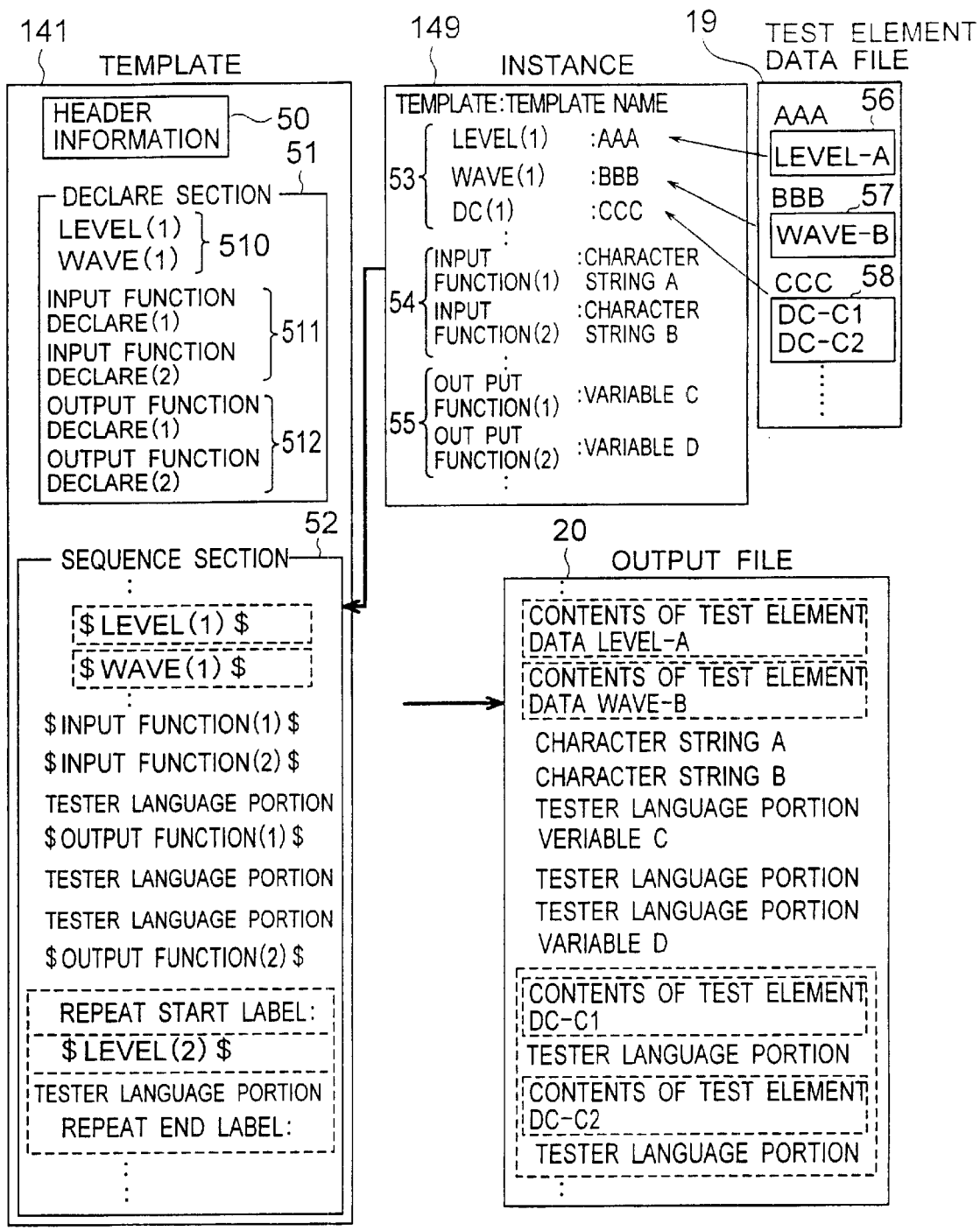
FIG. 5 is an explanatory view showing an example of configuration of data in generation and output of test program.

FIG. 5 is an explanatory view showing an example of the configuration of data in generation and output of test program.

Template file 141 consists of header information portion 50, declare section 51 and sequence section 52. The header information portion 50 describes information indicating attribute and kind of template file 141. The declare section 51 declares file name 510, input function 511 and output function 512 of test element data file 19 inserted into the template file. The sequence section 52 describes insertion portion of test program language and data declared at the declaration section 51 to thereby describe measurement sequence.

The configuration of the instance file 149 corresponds to the configuration of declaration section 51 of template file so as to take one-to-one correspondence relationship, and the instance file 149 designates file name 53 of test element data file inputted with respect to declared item, character string 54 inserted by input function and variable name 55 in which value to be taken in by output function is stored. In accordance with the configuration as described above, data are inserted into sequence section 52 of template file 141 to complete output file 20.

In the test program generation system and test program generation method for semiconductor test apparatus according to this invention, after generation of test element data and template file 141, an operator can freely or desirably define and/or change input function and output function within the template file 141. Thus, even in the case where there takes place necessity of change in the number of items or its position, etc., inserted into the sequence section 52 of the template file, it is possible to quickly cope with such a change without modifying the configuration of the system itself.

In addition, ordinarily, in DC test, test is carried out in such a manner that the same sequence is repeated while changing current/voltage application condition, pass/fail judgment condition, measurement pins and/or measurement pattern address. In view of this, in the test program generation system and test program generation method for semiconductor test apparatus according to this invention, after generation of test element data and template file 141, sequence portion to be repeatedly executed is declared as repetitive range to develop (expand) that sequence portion in the output file 20 by the number of times repeatedly executed. While the number of repetition times is indefinite every device, template file 141 can be thus used commonly to devices of respective specifications belonging to the same kind.

What is claimed is:

1. A test program generation system for semiconductor test apparatus comprising:

a memory adapted so that there are stored a library in which information common to a plurality of different kinds of LSI testers are registered, and a device information file in which inherent device information are registered for each of a plurality of different kinds of LSIs; and a library extraction/test element data generator for reading out data necessary for generating test programs of the respective different kinds of the LSI testers from the library and the device information file of the memory to convert the read out data into test element data commonly used for each of the plurality of different kinds of the LSI testers, said test element data including information relating to test programs.

2. A test program generation system for semiconductor test apparatus as set forth in claim 1, further comprising:

test element data library registration means for registering the test element data into the library of the memory.

3. A test program generation system for semiconductor test apparatus as set forth in claim 2, further comprising:

a plurality of test program generators provided correspondingly for each of the plurality of different kinds of the LSI testers for the purpose of converting the test element data to thereby prepare a test program correspondingly for each of the plurality of different kinds of the LSI testers by an ASCII format file; and a plurality of program translators provided correspondingly for each of the plurality of different kinds of the LSI testers for the purpose of carrying out a compile operation and a link operation of the test programs of the ASCII format file to thereby generate test programs of binary files which are executable programs correspondingly for each of the plurality of different kinds of the LSI testers.

4. A test program generation system for semiconductor test apparatus as set forth in claim 1, wherein conversion of data for generating the test element data is carried out in a state classified into a plurality of information files in which there are included the test element data necessary commonly to generation of the test programs of the respective plurality of different kinds of the LSI testers and a plurality of template files provided correspondingly for each of the plurality of different kinds of the LSI testers, wherein measurement sequences are described for each of the plurality of different kinds of the LSI testers, the test element data being inserted into the measurement sequences.

5. A test program generation system for semiconductor test apparatus as set forth in claim 4, wherein the plurality of template files are files in which an input function and an output function are capable of being defined or changed after generation of the test element data and the plurality of template files.

6. A test program generation system for semiconductor test apparatus as set forth in claim 4, wherein the plurality of template files are files in which a range to be repeatedly executed of the measurement sequences is capable of being designated after generation of the test element data and the plurality of template files.

7. A test program generation method for semiconductor test apparatus, comprising:

converting data necessary for generation of test programs of a plurality of different kinds of LSI testers of data of a library in which information common to the respective plurality of different kinds of the LSI testers are registered and data of a device information file in which inherent device information are registered for each of a plurality of different kinds of LSIs into test element data commonly used for each of the respective different kinds of the LSI testers, said test element data including information relating to test programs; and converting the test element data to thereby prepare test programs correspondingly for each of the plurality of different kinds of the LSI testers by an ASCII format file.

8. A test program generation method for semiconductor test apparatus as set forth in claim 7, further comprising:

carrying out a compile operation and a link operation of the test programs of the ASCII format file to thereby generate test programs of binary files which are executable programs correspondingly for each of the plurality of different kinds of the LSI testers.

9. A test program generation method for semiconductor test apparatus as set forth in claim 7, wherein conversion of data for generating the test element data at the first converting step is carried out in a state classified into a plurality of information files in which there are included the test element data necessary commonly to generation of the test programs of the respective plurality of different kinds of the LSI testers, and a plurality of template files provided correspondingly for each of the plurality of different kinds of the LSI testers, wherein measurement sequences are described for each of the plurality of different kinds of the LSI testers, the test element data being inserted into the measurement sequences.

10. A test program generation method for semiconductor test apparatus as set forth in claim 9, wherein the plurality of template files are files in which an input function and an output function are capable of being defined or changed after generation of the test element data and the plurality of template files.

11. A test program generation method for semiconductor test apparatus as set forth in claim 9, wherein the plurality of template files are files in which a range to be repeatedly executed of the measurement sequences is capable of being designated after generation of the test element data and the plurality of template files.

12. A test program generation method for semiconductor test apparatus as set forth in claim 7, wherein, after generation of the test element data at the first conversion step, the test element data is registered into the library.

* * * * *